United States Patent [19]

Na

[11] Patent Number: 5,444,783
[45] Date of Patent: Aug. 22, 1995

[54] AUTOMATIC SOUND VOLUME CONTROL DEVICE FOR ACOUSTIC INSTRUMENTS

[75] Inventor: Woon H. Na, Seoul, Rep. of Korea

[73] Assignee: Samsung Electronics Co., Ltd., Kungki-Do, Rep. of Korea

[21] Appl. No.: 183,240

[22] Filed: Jan. 19, 1994

Related U.S. Application Data

[63] Continuation of Ser. No. 902,375, Jun. 23, 1992, abandoned.

[30] Foreign Application Priority Data

Jul. 19, 1991 [KR] Rep. of Korea ............... 91-12408

[51] Int. Cl.⁶ .............................................. H03G 3/24
[52] U.S. Cl. ...................................... 381/57; 381/107
[58] Field of Search ................ 381/57, 104, 105, 107, 381/108, 109

[56] References Cited

U.S. PATENT DOCUMENTS

| 4,868,881 | 9/1989 | Zwicker et al. | 381/107 |
| 5,010,306 | 4/1991 | Kutzavitch et al. | 330/284 |
| 5,081,682 | 1/1992 | Kato et al. | 381/57 |

FOREIGN PATENT DOCUMENTS 0163545 12/1985 European Pat. Off. ............. 381/57

OTHER PUBLICATIONS

Radio Shack 1990 Catalog, p. 42, "Sound Level Meter".
GenRad Brochure on "The GR 1981 Precision Sound Level Meter", Received Oct. 31, 1979.

Primary Examiner—Forester W. Isen
Attorney, Agent, or Firm—Sughrue, Mion, Zinn, Macpeak & Seas; Richard C. Turner; Joseph J. Buczynski

[57] ABSTRACT

The present invention relates to a sound volume control device whereby the sound volume of an audio device is automatically controlled as a function of background noise. The apparatus includes a background noise detector means for generating driving signals; means for generating a control signal corresponding to the driving signals; and means for controlling the audio signal in accordance with the control signal, thereby providing the most suitable sound volume according to the background noise without manually controlling a volume switch. In a preferred arrangement, the driving signals are also used to drive the segments of a digit display, to give a visual indication of the sound pressure of the background noise.

9 Claims, 4 Drawing Sheets

FIG. 3

| Number Displayed | Voltage For 7 − Segment | | | | | | |
|---|---|---|---|---|---|---|---|
| | Va | Vb | Vc | Vd | Ve | Vf | Vg |
| 0 | H | H | H | H | H | H | L |
| 1 | L | L | H | H | L | L | L |
| 2 | L | H | H | L | H | H | H |
| 3 | L | H | H | H | H | L | H |
| 4 | H | L | H | H | L | L | H |
| 5 | H | H | L | H | H | L | H |
| 6 | H | H | L | H | H | H | H |
| 7 | L | H | H | H | L | L | L |
| 8 | H | H | H | H | H | H | H |
| 9 | H | H | H | H | H | L | H |

AUTOMATIC SOUND VOLUME CONTROL DEVICE FOR ACOUSTIC INSTRUMENTS

This is a Continuation of application No. 07/902,375 filed Jun. 23, 1992, now abandoned.

BACKGROUND OF THE INVENTION

The present invention relates to a sound volume control device whereby sound volume of an acoustic source is automatically controlled as a function of background noise. More particularly, the invention relates to such a device for automatically controlling the gain of an amplifier based upon the detected noise level.

Generally, most users of acoustic devices, for example, televisions, cassette tape records, radios, etc., manually control the sound level to a low level in the quiet of night time and to a high level in the noise of day time.

In conventional acoustic devices, sound volume has been varied by manually operating a sound volume control for controlling the gain of a variable gain amplifier. This is disadvantageous because users often have to operate the volume control by means of a remote or key operated controller.

SUMMARY OF THE INVENTION

The present invention has been made in order to resolve the above drawback. According to the present invention, an automatic sound volume control device for acoustic sources is ,provided whereby the level of the audio signal is automatically controlled depending upon the level of the detected background noise.

In order to achieve the foregoing object, an automatic sound volume control device for an acoustic device outputting an audio signal comprises: background noise detecting means for generating driving signals; means for generating a control signal corresponding to the driving signals; and means for controlling the audio signal in accordance with said control signal.

Other features and operations of the present invention will become apparent from the following description of the preferred embodiments when taken in conjunction with the accompanying drawings.

BRIEF DESCRIPTION OF THE DRAWINGS

FIG. 3 is a table showing the kinds of driving signals for driving the seven segments of the tens-position of a digit display.

DESCRIPTION OF THE PREFERRED EMBODIMENTS

Figure 1:
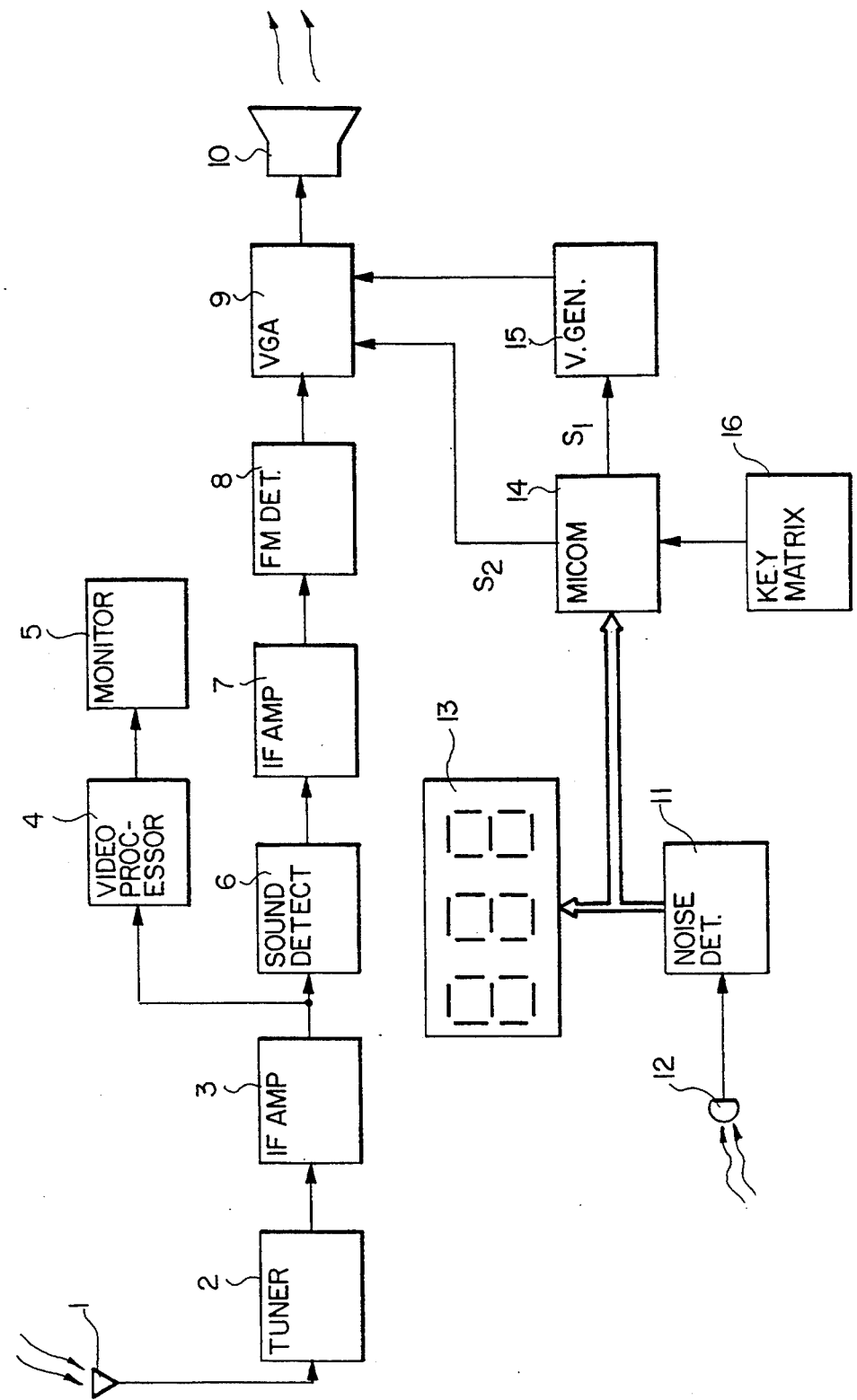
FIG. 1 is a block diagram of an automatic sound volume control device according to the present invention.

FIG. 1 is a block diagram of a color television having an automatic sound volume control device as a preferred embodiment of the present invention. A television broadcasting signal which is received through antenna 1 is mixed with a local oscillating frequency by the super-heterodyne method in the tuner 2, thereby converting the signal into a signal of an intermediate frequency. The intermediate frequency signal is then provided to intermediate frequency amplifier 3. A video signal output from the intermediate frequency amplifier 3 is displayed on monitor 5 through video processor 4. On the other hand, an audio signal output from the intermediate frequency amplifier 3 is provided to sound detecting circuit 6. The output of the sound detecting circuit is amplified by sound intermediate frequency amplifier 7 and output through speaker 10 via FM detector 8 and variable gain amplifier (low frequency amplifier) 9. Since these are well-known technologies in color television or FM receiving devices, a more concrete description will be omitted.

Noise detector 11 detects background noise through external microphone 12, and provides driving signals for displaying the noise level on digit display 13 (also known as a digitron) in accordance with the volume of the detected background noise. Microcomputer (micom) 14 recognizes signals being provided from noise detector 11 to segments of the tens-position of the digit display 13, and at the same time generates and provides a selected pulse width modulated signal S1 to control voltage generator 15. The control voltage generator 15 integrates the pulse width modulation signal, and provides a voltage signal corresponding to the integrated signal to variable gain amplifier 9, either directly or after a selected delay time.

Accordingly, the sound volume through speaker 10 is automatically controlled in accordance with the volume of background noise. Here, signal S2 provided from microcomputer 14 to variable gain amplifier 9 is a signal for use in manually controlling the gain of the amplifier 9, which is generated in response to an input signal from key-matrix 16.

Figure 2:
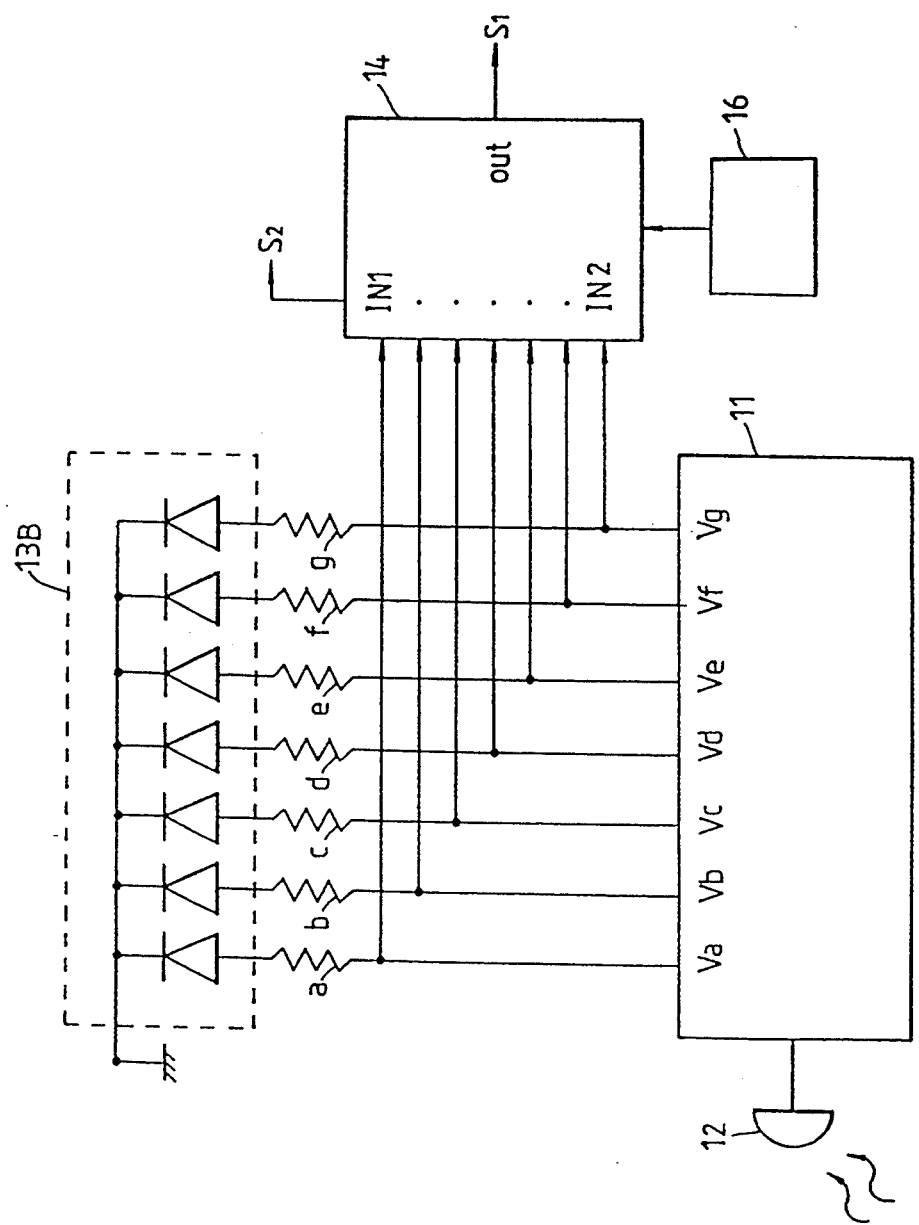
FIG. 2 is a detailed diagram illustrating features that a micom recognizes as noise level from driving signals which drive a digit display in accordance with background noise detected by a noise detecting means.

FIG. 2 is a diagram illustrating how microcomputer recognizes the noise level from the driving signal, which driving signal is also being provided from the noise detector to the seven segments of the tens-position of the digitron. In the drawing, numeral 13B shows the segments of the tens-position of digitron 13 as shown in FIG. 1. The segments are composed of seven LEDs, each of which is selectively activated. The reason why the invention uses signals provided to only the segments of the one display position is that noise level in a given room is generally around several tens of dB. If the detected noise level is more than 100 dB or less than 10 dB, the presently set sound volume is output, that is, the microcomputer is not activated.

Microcomputer 14 checks whether or not an automatic sound volume control signal is input from key-matrix 16. In the case that the automatic sound volume control signal is input, microcomputer 14 controls the audio level by controlling the gain of the variable gain amplifier 9, making use of the signals which drive display 13 in response to the level background noises. Otherwise, the sound volume is manually controlled by a remote controller or key-matrix 16.

FIG. 3 is a table showing the combination of signals for driving the seven segments of the LEDs 13B, which noise detector 11 generates in accordance with the background noise. As can be seen from the drawing, each of the segments has an identity from a to g for the purpose of explanation. Each of the segments is ON under a high level signal from noise detector 11 and is OFF under a low level signal. Therefore, the segments display numerals 0 to 9 according to the combination of signals being provided to each of the segments.

For example, if high level signals are provided to segments a to f and a low level signal is provided to segment g, digit display displays arabic numeral 0.

Figure 4:
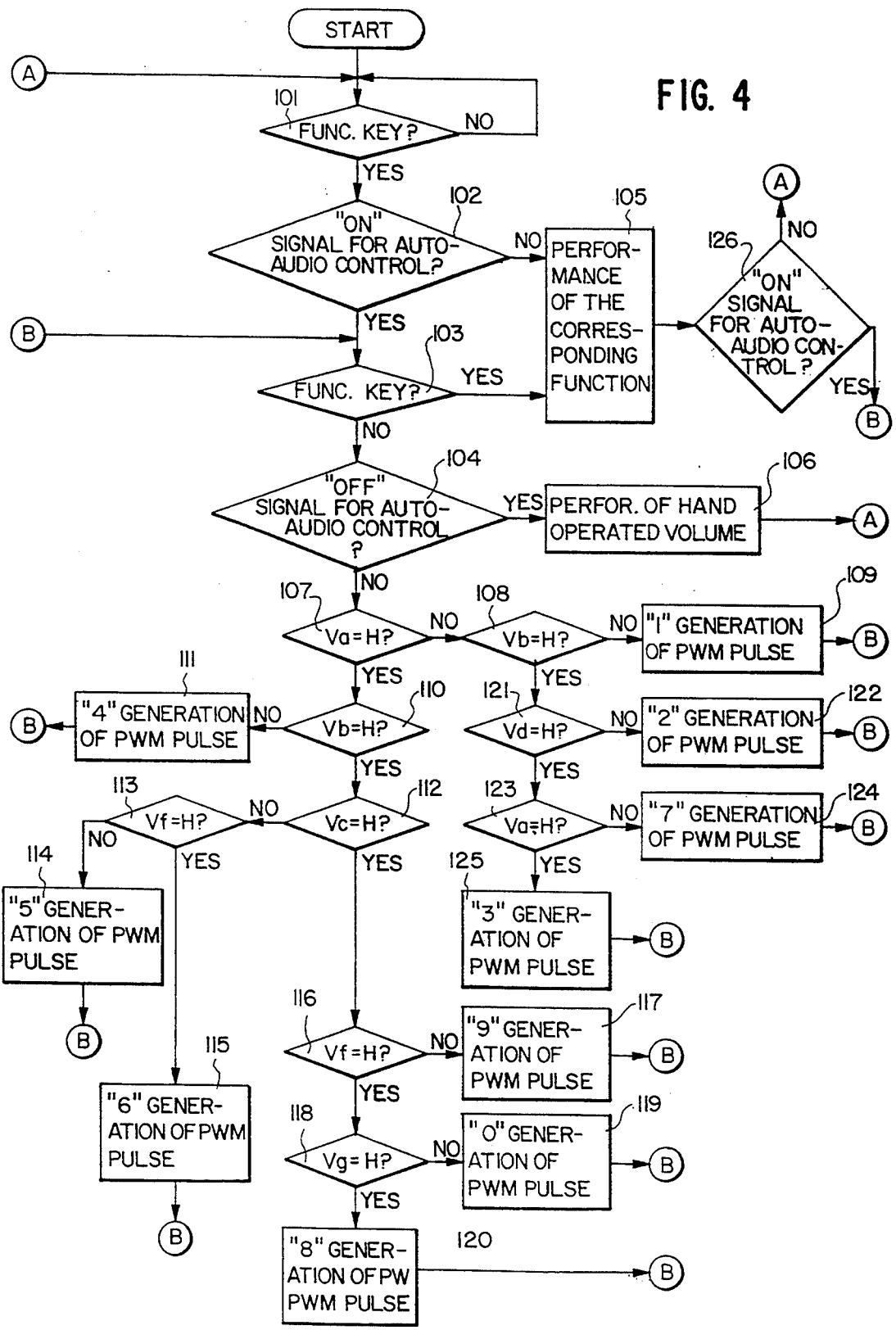
FIG. 4 is a flowchart illustrating the operation of the present invention.

FIG. 4 is a flowchart illustrating the operation of an automatic sound volume control device according to the present invention.

Microcomputer 14 checks whether any function key signal is input from key-matrix 16 (step 101), and goes to step 102 upon detecting any function key signal. Microcomputer 14 also checks at step 102 whether the input function key signal is an ON signal for an automatic audio control. In the case that the input signal is not the ON signal for automatic audio control, after performing the corresponding function at step 105, micom 14 goes back to step 101 through step 126. At step 102, in the case that the input signal is the ON signal for automatic audio control, micom proceeds to step 103 and also detects whether any function key signal is input.

If there is any function key signal input, micom proceeds to step 105, performs the corresponding function, and further proceeds to step 126. At step 126 micom checks whether the ON signal for automatic audio control is still maintained. If it is, the process proceeds to step 103; otherwise, back to step 101. Again, at step 103, if there is no function key signal, the process advances to step 104 at which it is determined whether an OFF signal for auto-audio control is input. If the OFF signal is input, the process proceeds to step 106 at which the sound volume is made manually controllable, and then proceeds back to step 101. If there is no OFF signal at step 104, micom 14 proceeds to step 107, and recognizes the driving signals provided from noise detector 11 to digitron 13 so as to control the gain of variable gain amplifier 9.

Micom 14 generates and provides a pulse width modulated signal which is variable according to the state of the detected driving signal Va to Vg to control voltage generator 15. Details will be explained below with reference to FIG. 4.

At step 107, if voltage Va for driving segment a is low (L), the flow proceeds to step 108. In the case that voltage Vb is also low at step 108, micom 14 recognizes that the present noise level is from 10 dB to 20 dB, and generates a corresponding first pulse width modulated (PWM) (step 109) signal. Here, since when voltages Va and Vb are both low, numeral 1 is displayed at the tens-position of digitron 13, the user can recognize that the present noise level is from 10 dB to 20 dB.

Back to step 107, if voltage Va is H, the flow proceeds to step 110. At step 110, if micom 14 goes to step 111 upon detecting that voltage Vb is L, numeral 4 is being displayed on digitron 13B in this case.

The micom 14 recognizes the present noise level as being between 40 dB up to 50 dB in this case, and generates a corresponding second PWM signal (step 111). However, at step 110 if voltage Vb is H, micom 14 proceeds to step 112 and checks the state of voltage Vc. If voltage Vc is L, the flow proceeds to step 113, and the state of voltage Vf is checked. At step 113, if voltage Vf is L, micom 14 recognizes that the present noise level is between 50 dB and 60 dB, while the display indicates numeral 5. The micom 14 generates a third corresponding PWM signal (step 114), and then goes back to step 103. On the other hand, if voltage Vf is H, micom 14 recognizes that the present noise level is between 60 dB and 70 dB, while the display registers numeral 6. Accordingly, micom 14 generates a fourth PWM signal (step 115), and then goes back to step 103.

Back to step 112, if voltage Vc is H, the flow proceeds to step 116. Here, when voltages Va, Vb and Vc are high, numerals 0, 8 and 9 are displayed. Also, since voltages Vd and Ve for displaying the numerals 0, 8 and 9 are all high, there is no need at this step to check voltages Vd and Ve. Therefore, at step 116 micom 14 checks voltage Vf. If voltage Vf is L, micom 14 recognizes that the present noise level is more than 90 dB, and therefore generates a fifth PWM signal (step 117), and then goes back to step 103. Otherwise, micom 14 proceeds to step 118 and checks voltage Vg. At step 118, if voltage Vg is L, micom 14 recognizes that the present noise level is less than 10 dB and generates a sixth PWM signal (step 119), and then returns back to step 103; if voltage Vg is H (that is, when voltages Va, Vb, Vc, Vd, Ve, Vf and Vg are all high), micom 14 recognizes that the present noise level is between 80 dB and 90 dB and therefore generates a seventh PWM signal, and then returns to step 103.

Now, in the case that voltage Vb is H at step 108 (that is, Va=L, Vb=H), the flow goes to step 121. Here, when voltage Va is L and voltage Vb is H, numeral 2, 3 and 7, as can be seen from FIG. 3, are displayed. Also, since voltage Vc for displaying the numerals 2, 3 and 7 is H, it is not necessary to check voltage Vc. Therefore, voltage Vd is checked at step 121. If voltage Vd is L (that is, Va=L, Vb=H and Vd=L), micom 14 recognizes that the present noise level is between 20 dB and 30 dB and therefore generates an eighth PWM signal corresponding to the detected noise level (step 122), and returns to step 103; if voltage Vd is H, the flow proceeds to step 123.

If voltage Ve is L at step 123 (that is, Va=L, Vb=Vc=Vd=H, Ve=L), numeral 7 is displayed on display 13B and the micom 14 recognizes the present noise level as being between 70 dB and 80 dB, and accordingly generates a ninth PWM signal (step 125), and then returns to step 103.

As described above, according to the present invention, since the micom detects the level of background noise by recognizing signals which also drive the segments of the tens-position of a digitron in order to display the level of the background noise as measured by a noise detector, and provides a PWM signal corresponding to the detected noise level to a control voltage generator, and further since the control voltage generator controls the gain of a variable gain amplifier in response to the PWM signals, the output sound volume is automatically varied according to the level of the background noises, thus resolving the inconvenience of the need for manual control of the sound volume.

Although the present invention has been disclosed using one preferred embodiment, it is recognized that variations and changes can be made without departing from the scope and spirit of the invention as set forth in the claims.

What is claimed is:

1. An automatic sound volume control device for an audio device which outputs an audio signal comprising:
   a background noise level digital display;
   background noise detecting means for generating display driving signals each for driving a segment of said digital display, said display driving signals are each a voltage for driving a segment of a tens-position of the digital display;

control signal generating means for receiving said display driving signals and generating a control signal responsive to said display driving signals; and means for controlling the audio signal in accordance with said control signal.

2. An automatic sound volume control device as claimed in claim 1, wherein the control signal generating means includes means for generating a pulse width modulated signal according to said driving signals, and control voltage generating means for converting the pulse width modulation signal into a voltage signal.

3. An automatic sound volume control device as claimed in claim 2, wherein the control voltage generating means is an integrator.

4. An automatic sound volume control device as claimed in claim 2, further comprising delay means for varying the volume of the audio signal after a lapse of a predetermined time from detecting the noise level.

5. An automatic sound volume control device as claimed in claim 1, further comprising delay means for varying the volume of the audio signal after a lapse of a predetermined time from detecting the noise level.

6. An automatic sound volume control device as claimed in claim 1, further comprising delay means for varying the volume of the audio signal after a lapse of a predetermined time from detecting the noise level.

7. An automatic sound volume control device as claimed in claim 1, wherein the control signal generating means includes means for generating a pulse width modulated signal according to said driving signals, and control voltage generating means for converting the pulse width modulation signal into a voltage signal.

8. An automatic sound volume control device as claimed in claim 7, wherein the control voltage generating means is an integrator.

9. An automatic sound volume control device as claimed in claim 7, further comprising delay means for varying the volume of the audio signal after a lapse of a predetermined time from detecting the noise level.

* * * * *